United States Patent [19]

Chin et al.

[11] 4,238,686
[45] Dec. 9, 1980

[54] METHOD OF ANALYZING LOCALIZED NONUNIFORMITIES IN LUMINESCING MATERIALS

[75] Inventors: Aland K. Chin; Gilbert Y. Chin, both of Berkeley Heights; Henryk Temkin, New Providence, all of N.J.

[73] Assignee: Bell Telephone Laboratories, Incorporated, Murray Hill, N.J.

[21] Appl. No.: 72,366

[22] Filed: Sep. 5, 1979

[51] Int. Cl.³ .................................................. A61K 27/02
[52] U.S. Cl. ............................. 250/492 A; 250/310; 250/312
[58] Field of Search ............... 250/492 A, 310, 306, 250/458, 312; 324/158 T

[56] References Cited

U.S. PATENT DOCUMENTS

| | | | |
|---|---|---|---|
| 3,767,304 | 10/1973 | Keenan et al. | 250/492 A |
| 4,008,402 | 2/1977 | O'Keeffe | 250/492 A |

*Primary Examiner*—Harold A. Dixon
*Attorney, Agent, or Firm*—Richard D. Laumann

[57] ABSTRACT

Localized nonuniformities in semiconductor crystals are analyzed by scanning the semiconductor surface with an electron beam and detecting and analyzing the radiation that is generated at the semiconductor surface by the electron beam and which passes through the semiconductor crystal.

7 Claims, 2 Drawing Figures

4,238,686

METHOD OF ANALYZING LOCALIZED NONUNIFORMITIES IN LUMINESCING MATERIALS

TECHNICAL FIELD

This invention is concerned with a method for analyzing localized nonuniformities in luminescing materials such as semiconductors.

BACKGROUND OF THE INVENTION

The presence of localized nonuniformities in luminescing materials, including semiconductors, is of both theoretical and practical importance. The practical importance of understanding and analyzing such nonuniformities, for example, defects, dislocations and growth striations in semiconductors arises because they may greatly alter device performance even to the point of rendering the device inoperative or greatly reducing device efficiency and lifetime. Early detection of such nonuniformities in the semiconductor device processing sequence is desirable because of the potential savings in device processing costs as the device processing sequence may be terminated if the semiconductor crystal is found to be defective. Accordingly, techniques have been devised to detect and analyze nonuniformities.

Some techniques, for example, etching, are useful in studying nonuniformities such as dislocations. However, they are inherently destructive of the material under study and are therefore not useful in testing all devices going through a processing sequence.

Several nondestructive approaches to analyzing localized nonuniformities, including the use of optical and electron beam techniques, have been tried. The optical techniques are limited in resolution by the relatively long wavelength of the light used. The attention of those people studying nonuniformities in semiconductors has therefore been directed towards use of an electron beam, with its promise of resolution better than that attainable with optical techniques, to study nonuniformities. Two exemplary electron beam methdods that are representative of the prior art will be briefly described.

The first method uses an electron beam scanned across the surface of a semiconductor crystal to produce electron-hole pairs in the semiconductor. Electrical contacts are made to opposite surfaces of the semiconductor and an internal electric field will, under appropriate conditions, separate the electrons and holes and cause an external electrical current to flow. The magnitude of the current, which is a function of the electron-hole recombination time, yields information as to the presence of defects and growth striations. Nonuniformities, such as defects and growth striations, alter the recombination time and are recognized by changes in the external current. This method is commonly referred to by the acronym, EBIC, for electron beam induced current.

The second method, cathodoluminescence (CL), also scans an electron beam across the surface of the material to study localized nonuniformities. In this method, the electron beam creates electron-hole pairs which recombine and emit light which is observed. Variations in the intensity of the emitted light, which is again a function of the electron-hole recombination time, yeilds information as to the presence of surface defects and growth striations.

Although both methods permit nondestructive analysis, each has drawbacks. EBIC requires electrical contacts to be made to the semiconductor and can detect only electrically active defects. Both EBIC and cathodoluminescence permit analysis of only a surface layer having a depth equal to the range of the electron beam. Additionally, cathodoluminescence suffers from signal to noise problems and requires sophisticated collection optics that do not interfere with the electron beam.

SUMMARY OF THE INVENTION

We have found that the entire volume of a luminescing material may be analyzed for localized nonuniformities by using the cathodoluminescence generated by a scanning electron beam on one surface of the luminescing material to provide illumination that is transmitted through the semiconductor and detected on the other side of the semiconductor by a photodetector. The luminescence generated at the surface of the material is thus used to analyze the material volume below the surface for localized nonuniformities. Variations in the magnitude of the transmitted radiation provide information as to both the nature and location within the sample volume of the localized nonuniformities. The method appears especially useful for studying semiconductors including Group III-V compounds such as GaAs, GaAlAs, InP and InGaAsP.

DETAILED DESCRIPTION

It is believed that the method of this invention, referred to as transmission cathodoluminescence, will be better understood if a prior art cathodoluminescence technique is briefly described first.

Figure 1:
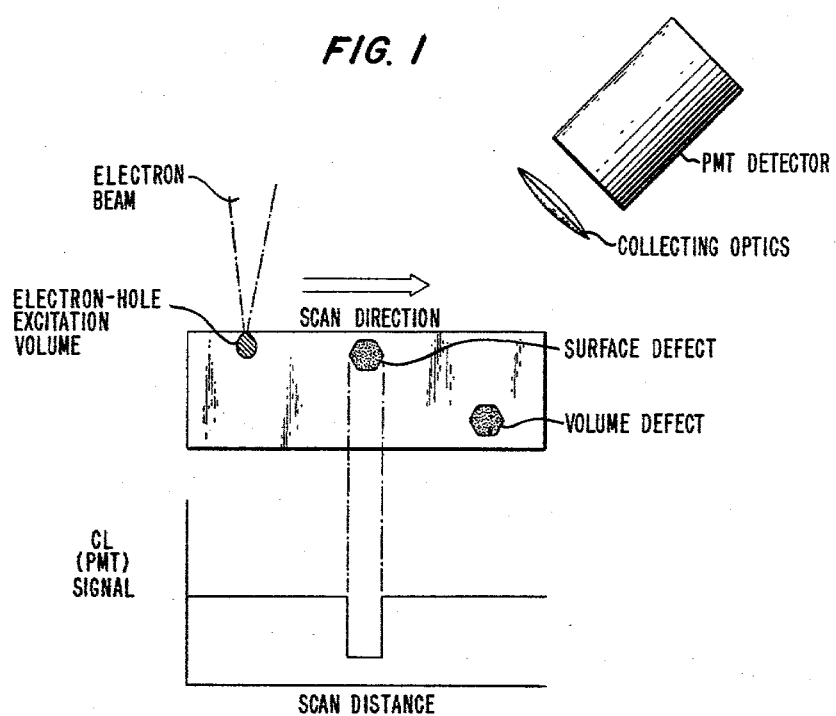
FIG. 1 is a schematic representation of apparatus for a cathodoluminescence measurement.

FIG. 1 is a schematic representation of apparatus for cathodoluminscence measurements. An electron beam is scanned across the surface of the material, typically a semiconductor, and produces electron-hole pairs in a localized region, referred to as the excitation volume, in the semiconductor surface layer. Lateral scattering of the primary electrons and diffusion of the secondary electrons result in the approximately tear-shaped excitation volume. The electron-hole pairs recombine and the resulting radiation is observed through the collecting optics and a photomultiplier tube (PMT). The magnitude of the PMT signal as a function of the scanning electron beam coordinates provides information as to the presence and location of surface defects. A change, usually a decrease, in the intensity of the PMT signal indicates the presence of defects as they have a cathodoluminescence efficiency different from that of perfect crystals. While a change in luminescent radiation is, therefore, an indication of the presence of surface defects, no information is obtained with respect to the presence of volume defects because of the limited range in the semiconductor of the electron beam.

Figure 2:
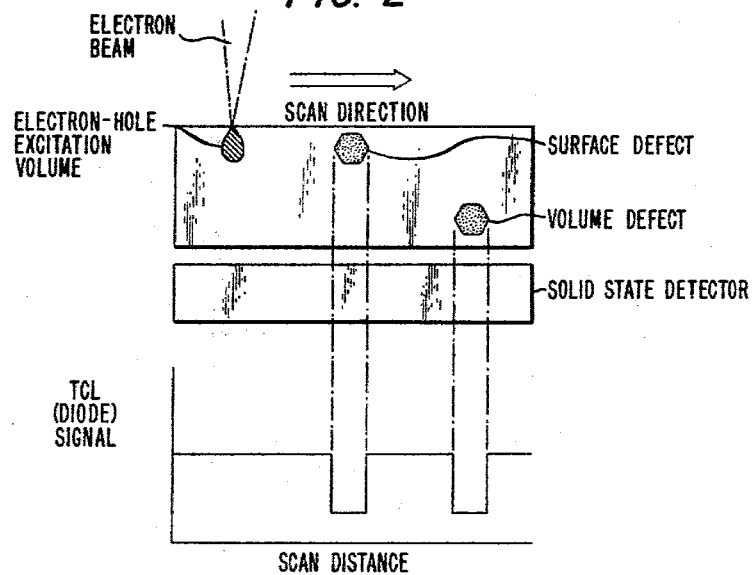
FIG. 2 is a schematic representation of apparatus for a transmission cathodoluminescence measurement.

FIG. 2 is a schematic representation of apparatus for transmission cathodoluminescence measurements. The surface of the luminescing material, typically a semiconductor, is scanned by an electron beam. The electron beam generates electron-hole pairs in the excitation volume and upon recombination of the pairs, luminescence is generated which passes through the volume of the semiconductor. This radiation is detected on the side of the semiconductor opposite to that of the electron beam by a photodetector. A solid state photodetector is typically spaced 0.3 cm from the semiconductor. As collection efficiency decreases as the spacing between the semiconductor and the photodetector increases, the semiconductor and photodetector should be spaced as close together as is practical. The proximity of semiconductor and photodetector results in a collection efficiency that is unattainable with the cathodoluminescence technique.

Exemplary solid state photodetectors are silicon and germanium photodiodes. As is well known, Ge is sensitive to longer wavelengths than is Si and is able to image some defects Si cannot. For example, some defects in InGaAsP are imaged only with Ge.

The electrical signal resulting from detection of the transmitted radiation is sensitive to the presence of both surface and volume defects conveniently displayed on a cathode ray tube for analysis purposes. Analysis of changes in the signal magnitude yields information regarding defect type and location within the sample volume.

Numerous types of defects may be located with this method. For example, surface defects have a lower cathodoluminescence efficiency than do perfect crystals and are detected as a decrease in cathodoluminescence radiation transmitted through the semiconductor. Volume defects interact with the surface generated cathodoluminescence radiation which passes through the sample to the photodetector. A void in the sample increases radiation transmission due to the reduced absorption. A volume defect decreases the intensity of radiation transmitted through the semiconductor due to increased absorption or scattering.

Growth striations which affect the optical and luminescent properties of the semiconductor are easily imaged by transmission cathodoluminescence. Dislocations which are not observable with cathodoluminescence are observed with transmission cathodoluminescence in, for example, silicon doped Group III-V compounds such as GaAs and GaAlAs. With this method, impurities and defects as small as 1 to 10 micrometers are easily detected and analyzed.

The electron beam may be from any conventional electron beam source such as a scanning electron microscope. The electron beam is scanned over the semiconductor surface using techniques that are well known to those working in the art and which need not be described in detail here. The beam width should be smaller than the defect size for general luminescing materials and smaller than the minority carrier diffusion length for semiconductors. The electron beam width is conveniently between approximately 100 Angstroms and 200 Angstroms. As the beam width becomes smaller, the resolution improves. However, if the intensity of the beam decreases, the number of electron-hole pairs generated will also decrease, and the transmitted luminescence will decline in intensity. A lower limit to beam intensity is thus imposed by the sensitivity of the photodetector. The beam intensity should exceed approximately 0.1 $\mu A$ for a photodetector having a noise equivalent power (NEP) of $10^{-12}$ watts/Hz$^{\frac{1}{2}}$.

The energy of the electron beam, conveniently available on a typical scanning electron microscope, is between 10 and 30 kiloelectron volts (kev). Energies within this range are sufficient for transmission cathodoluminescence measurements. Energies greater than 30 kev increase the danger that the semiconductor crystal will be damaged at electron beam currents of 1 $\mu A$ or greater. The lower limit is the practical limit imposed by the necessity that the radiation generated by electron-hole recombination be detected by the photodetector.

The semiconductor crystal being analyzed should be as thick as possible, consistent with the information being sought. The maximum thickness is limited by the absorption coefficient within the sample in a well known manner. The intensity of the cathodoluminescence can be calculated with sufficient accuracy when the beam current and energy and the absorption coefficient of the material are known. It has been found that thicknesses up to at least approximately 1 mm may be conveniently studied with transmission cathodoluminescence.

Further refinements in the method described are contemplated. For example, three-dimensional imaging of nonuniformities may be performed by obtaining transmission cathodoluminescence images along two directions, either by suitably modulating the electron beam or varying the sample orientation. That is, a second electron beam, strikes the material surface at an angle that differs from the angle at which the first beam strikes the surface. The first and second beams may be from the same electron source.

We claim:

1. A method of analyzing localized nonuniformities in luminescing materials comprising the steps of:
   scanning a surface of the luminescing material with an electron beam;
   detecting the radiation produced by said electron beam which passes through said semiconductor; and
   analyzing the intensity of said transmitted radiation.

2. A method as recited in claim 1 in which said luminescing material is a semiconductor.

3. A method as recited in claim 2 in which said semiconductor is a Group III-V compound.

4. A method as recited in claim 1 or 3 in which said electron beam has an energy between 10 and 30 kev.

5. A method as recited in claim 4 in which said electron beam has a width between 100 and 200 Angstroms.

6. A method as recited in claim 5 in which said semiconductor is selected from the group consisting of GaAs, GaAlAs, InGaAsP and InP.

7. A method as recited in claim 1 comprising the further step of scanning said semiconductor surface with a second electron beam, said second electron beam striking said semiconductor surface at a direction differing from said direction of said first electron beam.

* * * * *